US008817552B2

(12) United States Patent
Nagashima et al.

(10) Patent No.: US 8,817,552 B2
(45) Date of Patent: *Aug. 26, 2014

(54) SEMICONDUCTOR MEMORY DEVICE

(71) Applicant: Kabushiki Kaisha Toshiba, Minato-ku (JP)

(72) Inventors: Hiroyuki Nagashima, Yokohama (JP); Naoya Tokiwa, Fujisawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/864,015

(22) Filed: Apr. 16, 2013

(65) Prior Publication Data

US 2013/0308368 A1 Nov. 21, 2013

Related U.S. Application Data

(63) Continuation of application No. 13/271,645, filed on Oct. 12, 2011, now Pat. No. 8,477,542, which is a continuation of application No. 13/027,798, filed on Feb. 15, 2011, now Pat. No. 8,064,272, which is a continuation of application No. 12/394,712, filed on Feb. 27, 2009, now Pat. No. 7,911,854.

(30) Foreign Application Priority Data

Feb. 29, 2008 (JP) .................................. 2008-050626

(51) Int. Cl.
*G11C 8/08* (2006.01)
(52) U.S. Cl.
USPC .......... 365/189.06; 365/51; 365/63; 365/153; 365/163

(58) Field of Classification Search
USPC .......................... 365/51, 63, 163, 153, 189.06
See application file for complete search history.

(56) References Cited

U.S. PATENT DOCUMENTS

| 6,954,394 | B2 | 10/2005 | Knall et al. |
| 7,668,001 | B2 | 2/2010 | Tajiri et al. |
| 7,830,706 | B2 | 11/2010 | Hanzawa et al. |

(Continued)

FOREIGN PATENT DOCUMENTS

| JP | 2007-26627 A | 2/2007 |
| JP | 2007-129041 | 5/2007 |
| JP | 2007-149170 | 6/2007 |
| JP | 2009-158020 A | 7/2009 |

OTHER PUBLICATIONS

Office Action issued on Apr. 8, 2013 in the corresponding Taiwanese Application No. 098104195 (with English Translation).

*Primary Examiner* — Hoai V Ho
*Assistant Examiner* — Jay Radke
(74) *Attorney, Agent, or Firm* — Oblon, Spivak, McClelland, Maier & Neustadt, L.L.P.

(57) ABSTRACT

A semiconductor memory device comprises a plurality of memory layers arranged in multilayer, each memory layer including a cell array, the cell array containing a plurality of first parallel lines, a plurality of second parallel lines arranged crossing the first lines, and a plurality of memory cells connected at intersections of the first lines and the second lines; a pulse generator operative to generate pulses required for data access to the memory cell; and a control means operative to control the pulse generator such that the pulse output from the pulse generator has energy in accordance with the memory layer to which the access target memory cell belongs.

24 Claims, 15 Drawing Sheets

(56) References Cited

U.S. PATENT DOCUMENTS

| | | |
|---|---|---|
| 7,859,887 B2 | 12/2010 | Chen et al. |
| 2003/0123277 A1 | 7/2003 | Lowrey et al. |
| 2003/0214841 A9 | 11/2003 | Scheuerlein et al. |
| 2004/0114444 A1 | 6/2004 | Matsuoka |
| 2004/0145944 A1 | 7/2004 | Pashmakov |
| 2006/0028886 A1 | 2/2006 | Choi et al. |
| 2006/0197115 A1 | 9/2006 | Toda |
| 2006/0256613 A1 | 11/2006 | Dodge et al. |
| 2008/0258129 A1* | 10/2008 | Toda .................. 257/5 |

* cited by examiner

SEMICONDUCTOR MEMORY DEVICE

CROSS-REFERENCE TO RELATED APPLICATION

This is a continuation of U.S. application Ser. No. 13/271,645, filed Oct. 12, 2011, which is a continuation of U.S. application Ser. No. 13/027,798, filed Feb. 15, 2011, entitled "Semiconductor Memory Device," which is a continuation of U.S. application Ser. No. 12/394,712, filed Feb. 27, 2009, which is based upon and claims the benefit of priority from the prior Japanese Patent Application No. 2008-50626, filed on Feb. 29, 2008, the entire contents of each of which are incorporated herein by reference.

BACKGROUND OF THE INVENTION

1. Field of the Invention

The present invention relates to a semiconductor memory device, and more particularly to a stack-layer-structured semiconductor memory device using variable resistors.

2. Description of the Related Art

Electrically erasable programmable nonvolatile memories include a flash memory as well known in the art, which comprises a memory cell array of NAND-connected or NOR-connected memory cells having a floating gate structure. A ferroelectric memory is also known as a nonvolatile fast random access memory.

On the other hand, technologies of patterning memory cells much finer include a resistance variable memory, which uses a variable resistor in a memory cell as proposed. Known examples of the variable resistor include a phase change memory element that varies the resistance in accordance with the variation in crystal/amorphous states of a chalcogenide compound; an MRAM element that uses a variation in resistance due to the tunnel magneto-resistance effect; a polymer ferroelectric RAM (PFRAM) memory element including resistors formed of a conductive polymer; and a ReRAM element that causes a variation in resistance on electrical pulse application (Patent Document 1: JP 2006-344349A, paragraph 0021).

The resistance variable memory may configure a memory cell with a serial circuit of a Schottky diode and a resistance variable element in place of the transistor. Accordingly, it can be stacked easier and three-dimensionally structured to achieve much higher integration advantageously (Patent Document 2: JP 2005-522045A).

A semiconductor memory device having a stack-layered structure comprises memory layers, which differ in thermal history resulted from the process of stacking layers. Namely, the lower the memory layer, the more it is susceptible to heat. As a result, the oxidation degrees of the metal oxide vary among the memory layers and cause differences in write characteristic among the memory cells.

SUMMARY OF THE INVENTION

In an aspect the present invention provides a semiconductor memory device, comprising: a plurality of memory layers arranged in multilayer, each memory layer including a cell array, the cell array containing a plurality of first parallel lines, a plurality of second parallel lines arranged crossing the first lines, and a plurality of memory cells connected at intersections of the first lines and the second lines; a pulse generator operative to generate pulses required for data access to the memory cell; and a control means operative to control the pulse generator such that the pulse output from the pulse generator has energy in accordance with the memory layer to which the access target memory cell belongs.

In another aspect the present invention provides a semiconductor memory device, comprising: a plurality of memory layers arranged in multilayer, each memory layer including a cell array, the cell array containing a plurality of first parallel lines, a plurality of second parallel lines arranged crossing the first lines, and a plurality of memory cells connected at intersections of the first lines and the second lines, each memory cell containing an electrically rewritable variable resistor operative to store the resistance as data; a pulse generator operative to generate pulses required for data access to the memory cell; and a control means operative to control the pulse generator such that the pulse output from the pulse generator has energy in accordance with the memory layer to which the access target memory cell belongs.

In yet another aspect the present invention provides a semiconductor memory device, comprising: a cell array containing a plurality of first parallel lines, a plurality of second parallel lines arranged crossing the first lines, and a plurality of memory cells connected at intersections of the first lines and the second lines; a pulse generator operative to generate pulses required for data access to the memory cell; and a control means operative to control the pulse generator such that the pulse output from the pulse generator has energy in accordance with the access target memory cell.

DETAILED DESCRIPTION OF THE EMBODIMENTS

The embodiments associated with the semiconductor memory device according to the present invention will now be described with reference to the drawings.

First Embodiment

Figure 1:
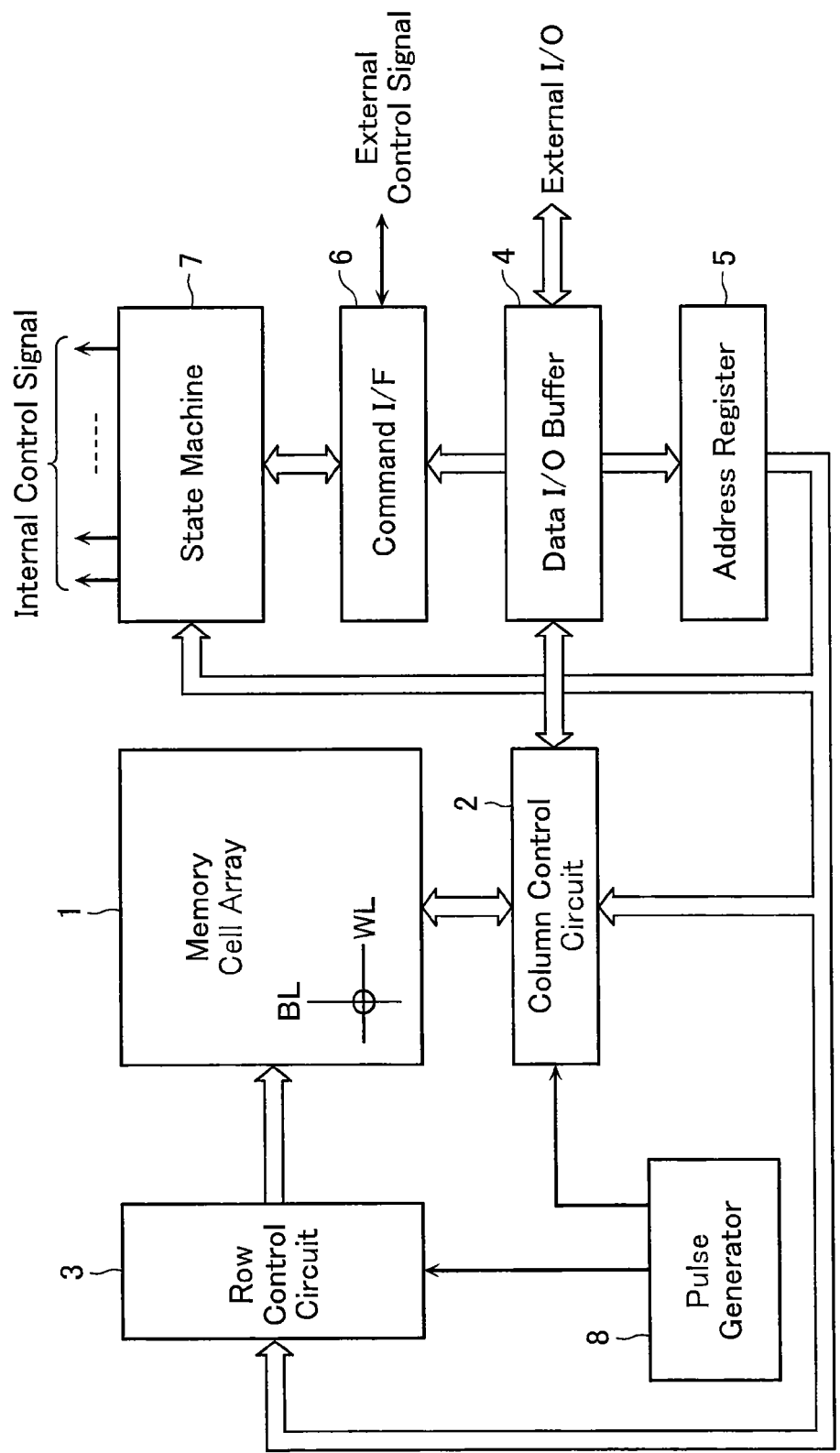
FIG. 1 is a block diagram of a semiconductor memory device according to a first embodiment of the present invention.

FIG. 1 is a block diagram of a semiconductor memory device according to a first embodiment of the present invention.

The semiconductor memory device comprises a memory cell array 1 of memory cells arranged in matrix, each memory cell including a later-described ReRAM (variable resistor). A column control circuit 2 is provided on a position adjacent to the memory cell array 1 in the bit line BL direction. It controls the bit line BL in the memory cell array 1 to erase data from the memory cell, write data in the memory cell, and read data out of the memory cell. A row control circuit 3 is provided on a position adjacent to the memory cell array 1 in the word line WL direction. It selects the word line WL in the memory cell array 1 and applies voltages required to erase data from the memory cell, write data in the memory cell, and read data out of the memory cell.

A data I/O buffer 4 is connected to an external host, not shown, via an I/O line to receive write data, receive erase instructions, provide read data, and receive address data and command data. The data I/O buffer 4 sends received write data to the column control circuit 2 and receives read-out data from the column control circuit 2 and provides it to external. An address fed from external to the data I/O buffer 4 is sent via an address register 5 to the column control circuit 2 and the row control circuit 3. A command fed from the host to the data I/O buffer 4 is sent to a command interface 6. The command interface 6 receives an external control signal from the host and decides whether the data fed to the data I/O buffer 4 is write data, a command or an address. If it is a command, then the command interface transfers it as a received command signal to a state machine 7. The state machine 7 manages the entire semiconductor memory device to receive commands from the host, read, write, erase, and execute data I/O management. The external host can also receive status information managed by the state machine 7 and decide the operation result. The status information is also utilized in control of write and erase.

The state machine 7 controls the pulse generator 8. Under this control, the pulse generator 8 is allowed to provide a pulse of any voltage at any timing. Specifically, the state machine 7 receives an address fed from external via the address resistor 5 to determine which memory layer is the access target, and uses a parameter corresponding to that memory layer to control the height and width of the pulse from the pulse generator 8. This parameter is a value derived by grasping characteristics of write and so forth in the memory layers to even write characteristics in the memory layers, and saved among the memory cells. The pulse formed herein can be transferred to any line selected by the column control circuit 2 and the row control circuit 3.

Peripheral circuit elements other than the memory cell array 1 can be formed in a silicon substrate immediately beneath the memory array 1. Thus, the chip area of the semiconductor memory device can be made almost equal to the area of the memory cell array 1.

Figure 2:
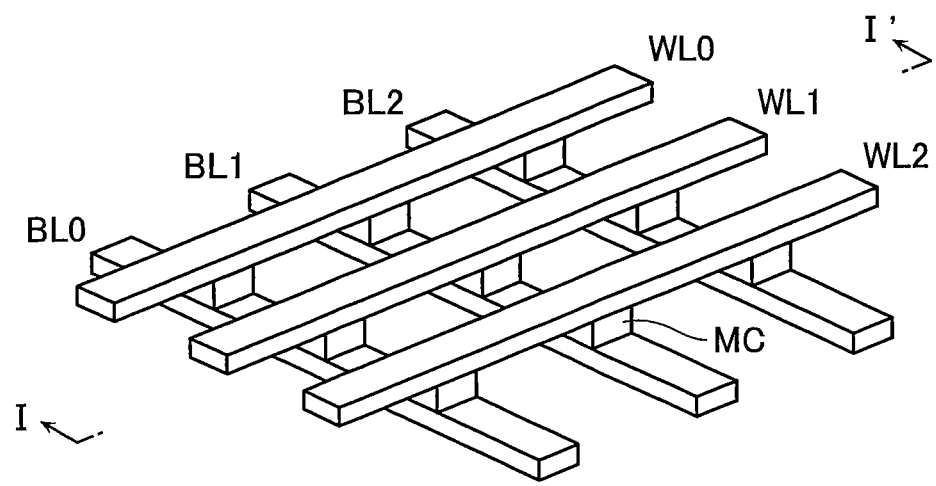
FIG. 2 is a perspective view of part of a memory cell array in the semiconductor memory device according to the same embodiment.
Figure 3:
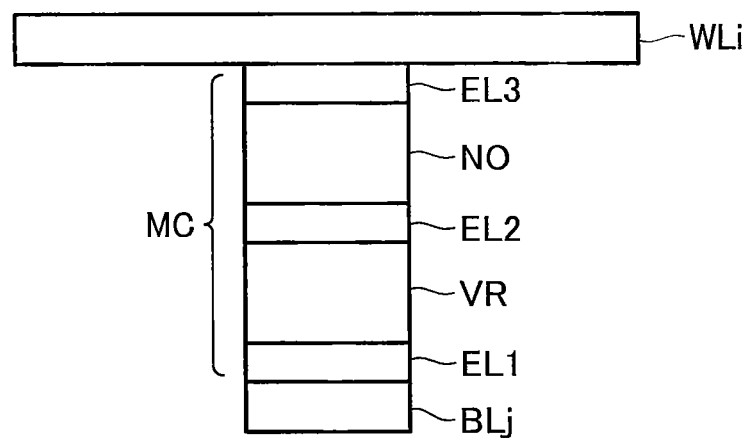
FIG. 3 is a cross-sectional view of one memory cell taken along I-I' line and seen from the direction of the arrow in FIG. 2.

FIG. 2 is a perspective view of part of the memory cell array 1, and FIG. 3 is a cross-sectional view of one memory cell taken along I-I' line and seen in the direction of the arrow in FIG. 2.

There are plural first lines or bit lines BL0-BL2 disposed in parallel, which cross plural second lines or word lines WL0-WL2 disposed in parallel. A memory cell MC is arranged at each intersection of both lines as sandwiched therebetween. Desirably, the first and second lines are composed of heat-resistive low-resistance material such as W, WSi, NiSi, CoSi.

The memory cell MC comprises a serial connection circuit of a variable resistor VR and a non-ohmic element NO as shown in FIG. 3.

The variable resistor VR can vary the resistance through current, heat, or chemical energy on voltage application. Arranged on an upper and a lower surface thereof are electrodes EL2, EL1 serving as a barrier metal and an adhesive layer. Material of the electrodes may include Pt, Au, Ag, TiAlN, SrRuO, Ru, RuN, Ir, Co, Ti, TiN, TaN, LaNiO, Al, PtIrOx, PtRhOx, Rh/TaAlN. A metal film capable of achieving uniform orientation may also be interposed. A buffer layer, a barrier metal layer and an adhesive layer may further be interposed.

The variable resistor VR may be one that includes a material such as chalcogenide that varies its resistance through the phase change between the crystal state and the amorphous state (PCRAM); may be one that varies its resistance through precipitation of metal cations to form a bridge (conducting bridge) between electrodes or ionize the precipitated metal to break the bridge (CBRAM); and may be one that varies its resistance through voltage or current application (ReRAM) (which is roughly divided into two: one that causes a resistance variation in response to the presence/absence of charge trapped in a charge trap present in an electrode interface, and another that causes a resistance variation in response to the presence/absence of a conduction path due to a loss in oxygen).

Figure 4:
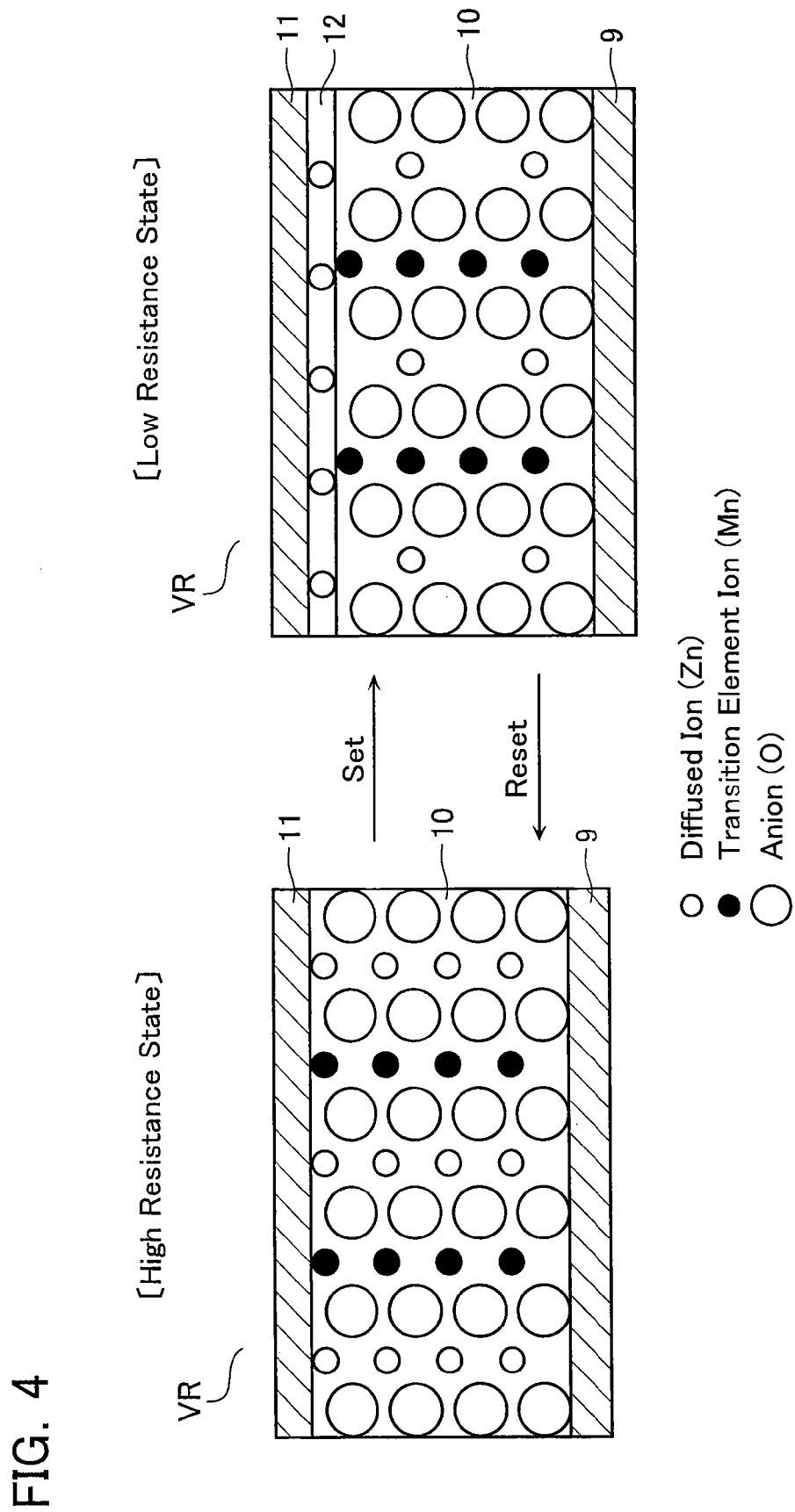
FIG. 4 is a schematic cross-sectional view showing a variable resistor example in the same embodiment.

FIG. 4 shows an example of the variable resistor VR comprising ReRAM. The variable resistor VR shown in FIG. 4 includes a recording layer 10 arranged between electrode layers 9, 11. The recording layer 10 is composed of a composite compound containing at least two types of cation elements. At least one of the cation elements is a transition element having the d-orbit incompletely filled with electrons, and the shortest distance between adjacent cation elements is 0.32 nm or lower. Specifically, the variable resistor VR is represented by a chemical formula $A_xM_yX_z$ (A and M are different elements) and may be formed of material having a crystal structure such as a spinel structure ($AM_2O_4$), an ilmenite structure ($AMO_3$), a delafossite structure ($AMO_2$), a $LiMoN_2$ structure ($AMN_2$), a wolframite structure ($AMO_4$), an olivine structure ($A_2MO_4$), a hollandite structure ($A_xMO_2$), a ramsdellite structure ($A_xMO_2$), and a perovskite structure ($AMO_3$).

In the example of FIG. 4, A comprises Zn, M comprises Mn, and X comprises O. In the recording layer 10, a small white circle represents a diffused ion (Zn), a large white circle represents an anion (O), and a small black circle represents a transition element ion (Mn). The initial state of the recording layer 10 is the high-resistance state. When the electrode layer 9 is kept at a fixed potential and a negative voltage is applied to the electrode layer 11, part of diffused ions in the recording layer 10 migrate toward the electrode layer 11 to reduce diffused ions in the recording layer 10 relative to anions. The diffused ions arrived at the electrode layer 11 accept electrons from the electrode layer 11 and precipitate as a metal, thereby forming a metal layer 12. Inside the recording layer 10, anions become excessive and consequently increase the valence of the transition element ion in the recording layer 10. As a result, the carrier injection brings the recording layer 10 into electron conduction and thus completes setting. On regeneration, a current may be allowed to flow, of which value is very small so that the material configuring the recording layer 10 causes no resistance variation. The programmed state (low-resistance state) may be reset to the initial state (high-resistance state) by supplying a large current flow in the recording layer 10 for a sufficient time, which causes Joule heating to facilitate the oxidation reduction reaction in the recording layer 10. Application of an electric field in the opposite direction from that at the time of setting may also allow resetting.

Figure 5:
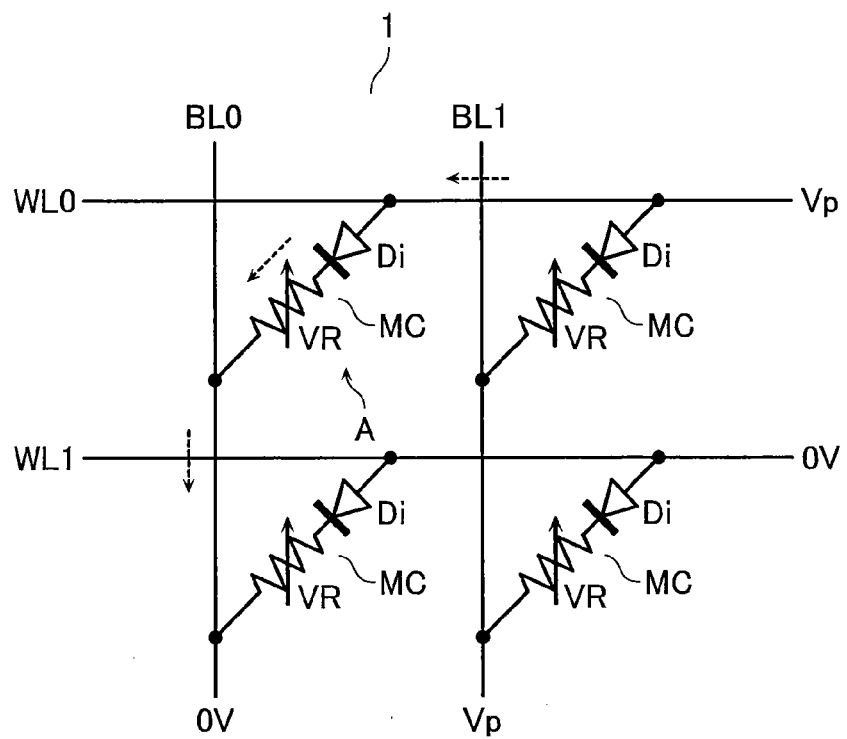
FIG. 5 is an equivalent circuit diagram of the memory cell array in the semiconductor memory device according to the same embodiment.

FIG. 5 is an equivalent circuit diagram of a memory cell array of 2×2 in the semiconductor memory device according to the present embodiment using the variable resistor VR shown in FIG. 4. As shown, accessible elements, for example, resistance variable memory cells MC, each including a diode D1 and a variable resistor VR serially connected, are arranged at intersections of the word lines WL and the bit lines BL.

In the circuitry of FIG. 5, the word lines WL are usually at "L" (0V) and the bit lines BL at "H" (Vp). When the word line WL0 is turned from "L" to "H" and the bit line BL0 from "H" to "L", the diode D1 in the memory cell MC shown with A in FIG. 5 is forward biased and accordingly current flows in the direction of the dotted line arrow. The variable resistor VR is in the low-resistance state or in the high-resistance state as described above. Therefore, sensing that the current is large or small enables data in the memory cell MC, A to be read out.

If the pulse voltage Vp applied to the word line WL0 is elevated to a voltage required for set and reset, it can set and reset the variable resistor VR in the memory cell MC, A.

Figure 6:
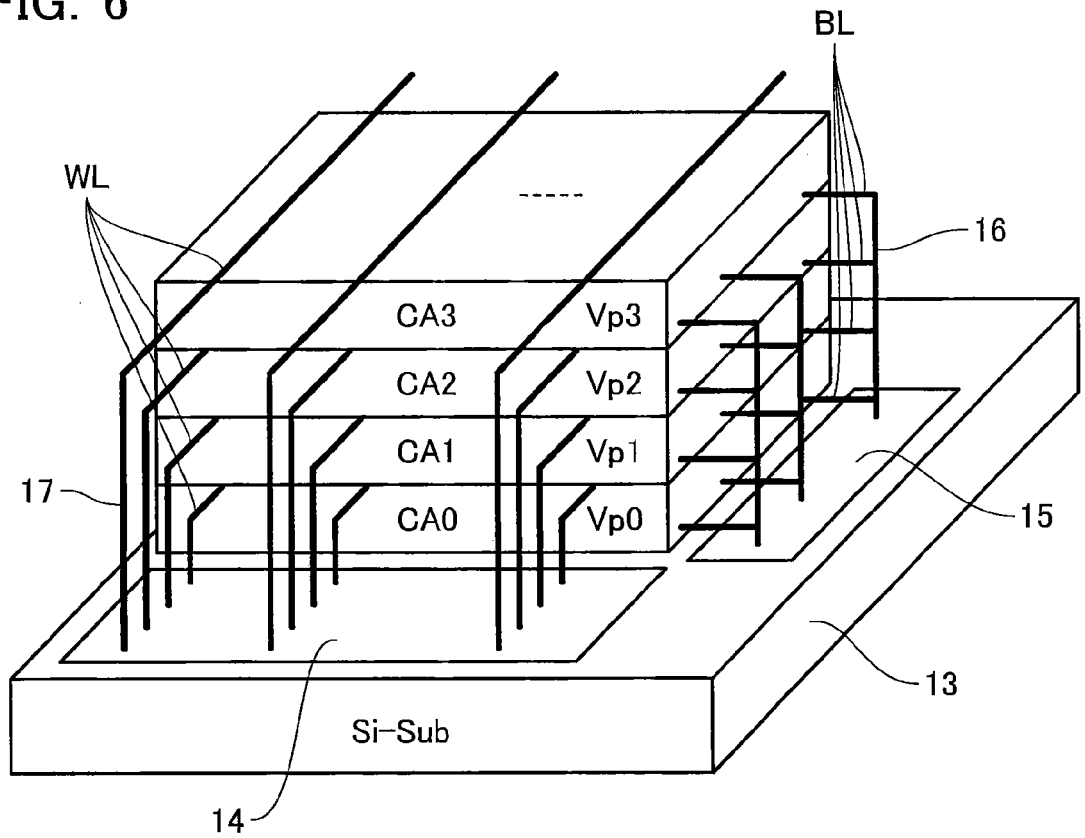
FIG. 6 is a perspective view showing part of the memory cell array in the semiconductor memory device according to the same embodiment.

FIG. 6 is a perspective view showing part of the memory cell array in the semiconductor memory device according to the same embodiment. This part includes plural memory layers CA stacked, each including the array of memory cells shown in FIG. 5.

The example herein shown includes four memory layers CA0-CA3 stacked on a silicon substrate 13. The bit lines BL in the memory layers CA are connected in common through via-lines 16 to a column control circuit 15 on the substrate 13. The word lines WL located on the memory layers CA0-CA3 are independently connected through via-lines 17 to a row control circuit 14 on the silicon substrate 13.

Figure 7:
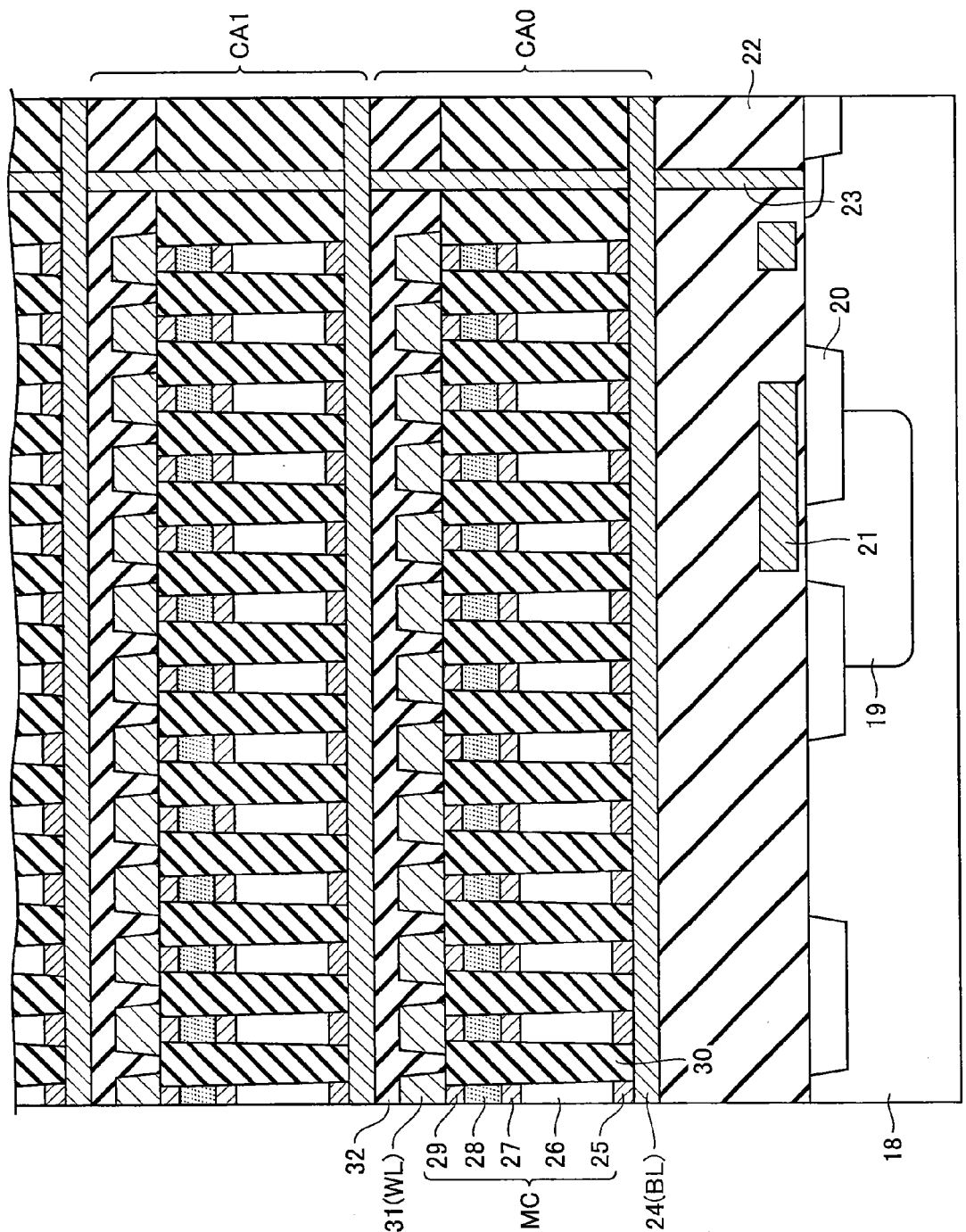
FIG. 7 is a cross-sectional view of the semiconductor memory device according to the same embodiment.

FIG. 7 is a cross-sectional view of the semiconductor memory device having the above-described stack-layered structure. There is provided a silicon substrate 18 having a well 19 formed therein, on which an impurity-diffused layer 20 and a gate electrode 21 of a transistor contained in a peripheral circuit are formed. A first interlayer insulator 22 is deposited thereon. A via-hole 23 is formed appropriately through the first interlayer insulator 22 to the surface of the silicon substrate 18. A first metal 24 configuring the first line or bit line BL in the memory cell array is formed of a low-resistance metal such as W on the first interlayer insulator 22. A barrier metal 25 is formed in an upper layer above the first metal 24. The barrier metal may be formed in a lower layer below the first metal 24. The barrier metal may be formed of both or one of Ti and TiN. A non-ohmic element 26 such as a diode is formed above the barrier metal 25. On the non-ohmic element 26, a first electrode 27, a variable resistor 28 and a second electrode 29 are formed in this turn, thereby configuring a memory cell MC including the barrier metal 25 through the upper electrode 29. A barrier metal may be interposed below the first electrode 24 and above the second electrode 29. A barrier metal and an adhesive may be interposed below the second electrode 29 and above the lower electrode 24. A second interlayer insulator 30 and a third interlayer insulator (not shown) are buried between the memory cell MC and an adjacent memory cell MC. On the memory cells MC in the memory cell array, a second metal 31 is formed to configure a second line or word line WL extending in the direction perpendicular to the bit line BL. A fourth interlayer insulator 32 is formed thereon. A multi-layered structure may be realized by stacking the first metal 24 through the fourth interlayer insulator 32 and forming the second interlayer insulator 30 and the third interlayer insulator between the memory cells MC, repeatedly by the number of layers required.

A method of manufacturing the semiconductor memory device according to the present embodiment shown in FIG. 7 is described next.

First, a FEOL (Front End of Line) process for forming transistors and so forth to form necessary peripheral circuits on the silicon substrate 18 is executed, and then the first interlayer insulator 22 is deposited thereon. The via-hole 23 is formed as well in this step.

Subsequently, the upper layer portion above the first metal 24 is formed.

Once the first interlayer insulator 22 and the via-hole 23 are formed as described above, deposition thereon of a layer turned into the first metal 24 in the memory cell array, formation of a layer turned into the barrier metal 25, deposition of a layer turned into the non-ohmic element 26, deposition of a layer turned into the first electrode 27, deposition of a layer turned into the variable resistor 28, and deposition of a layer turned into the second electrode 29 are executed sequentially. Through the above steps, the stacked body of the upper layer portion can be formed.

Subsequently, a hard mask of TEOS or the like, not shown, is formed on the upper surface of the stacked body, and a first anisotropic etching is executed with this mask to form trenches along the bit line BL to separate the stacked body.

Next, the second interlayer insulator is buried in this trench. For the second interlayer insulator, a suitable material has excellent insulation, a low capacity and an excellent burial property. Subsequently, a process of CMP or the like is applied in planarization to remove extra portions from the second interlayer insulator 30 and expose the upper electrode 29.

A layer of W or the like turned into the second metal 31 is stacked over the planarized portion after CMP. Thereafter, a hard mask of TEOS or the like is formed on this layer, and a second etching is executed with L/S (Line and Space) in the direction crossing the first etching, thereby forming trenches along the word line orthogonal to the bit line BL. At the same time, the memory cells MC separated in pillar shapes are formed at cross-points of the bit lines BL and the word lines WL in a self-aligned manner. Subsequently, the third interlayer insulator 30 is buried and then the third interlayer insulator 30 is planarized, thereby forming the memory array layer of the cross-point type.

Thus, through stacking flat films and patterning them twice with orthogonal L/S, such the cross-point cells can be formed in a self-aligned manner without any misalignment with lines.

The formation of the above stack-layered structure can be repeated to form the memory cell array of the multi-layered cross-point type.

During the formation of the memory cell array through the above process, film formation and formation of protective films produce a large amount of heat. Therefore, when a certain memory layer CA is stacked, the associated thermal history exerts the influence on lower memory layers CA and wiring layers.

The control means of the present embodiment compensates for differences in resistance in the initial state among the memory cells MC due to such the differences in thermal history of the memory layers CA, for differences in characteristic among non-ohmic elements and in resistance among lines, or for differences in write, erase and read characteristic. For that purpose, the control means controls the pulse generator 7 to change formation of pulse voltages applied on writing, erasing and reading at every memory layer CA.

The pulses controlled by the pulse generator 7 are described next with specific examples shown.

Figure 8:
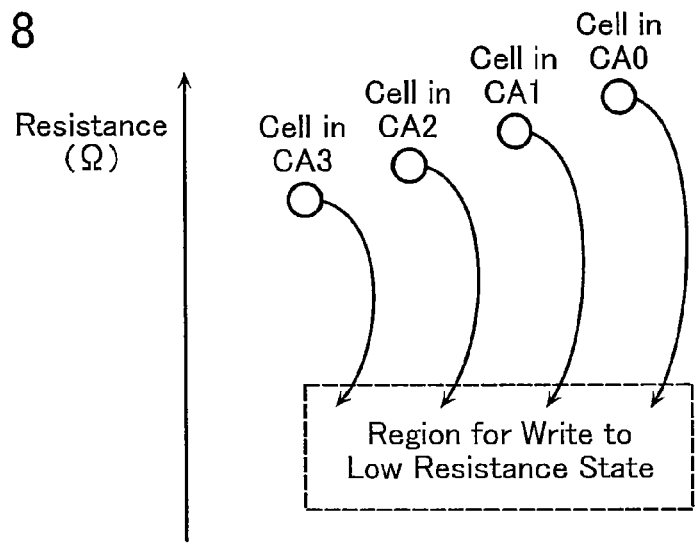
FIG. 8 is a brief diagram of writing in the semiconductor memory device according to the same embodiment.

FIG. 8 is a brief diagram of writing in the memory layers CA in the semiconductor memory device according to the first embodiment of the present invention.

FIG. 8 shows resistances in the initial state of the memory cells MC belonging to the lowermost memory layer CA0 through the uppermost memory layer CA3. As can be found, the lower the layer, the higher the resistance becomes. This is because the lower the layer, the more the thermal histories, and the influence thereby changes the oxidation degree of the metal oxide and increases the resistance of the variable resistance material of the memory cell MC. As a result, the lower the layer, the worse the write characteristic for the transition to the programmed state becomes and the larger the electrical energy required for writing becomes as shown by the arrow in FIG. 8.

Figure 9:
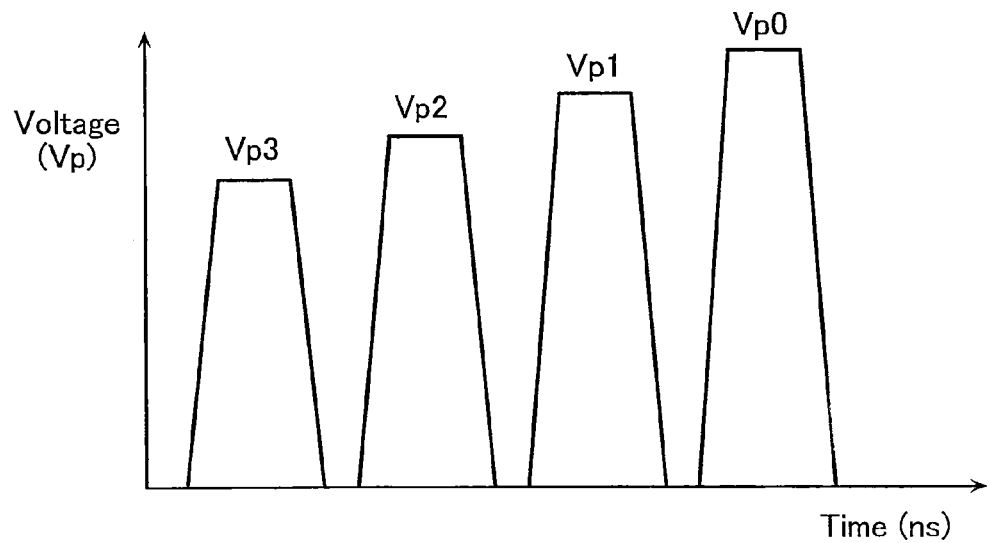
FIG. 9 is a graph showing a first example of pulse voltages for realizing writing of FIG. 8 in the semiconductor memory device according to the same embodiment.
Figure 10:
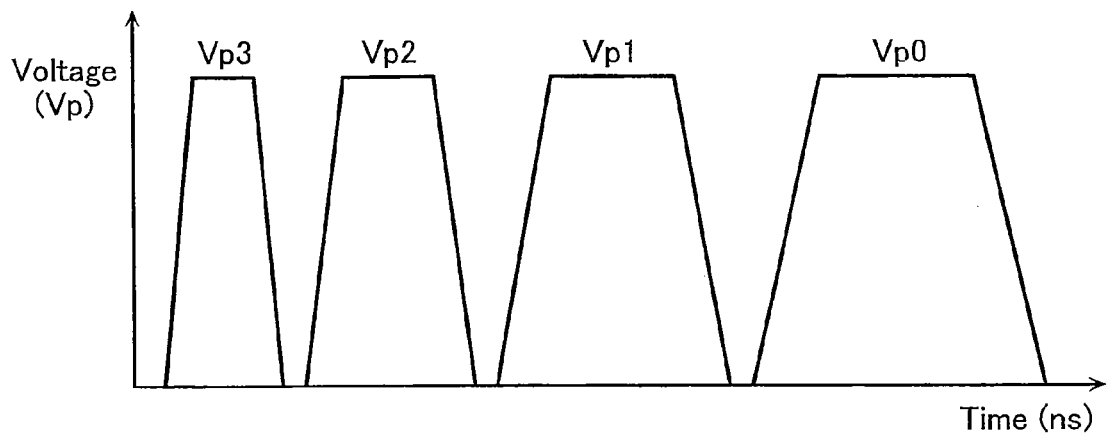
FIG. 10 is a graph showing a second example of pulse voltages for realizing writing of FIG. 8 in the semiconductor memory device according to the same embodiment.
Figure 11:
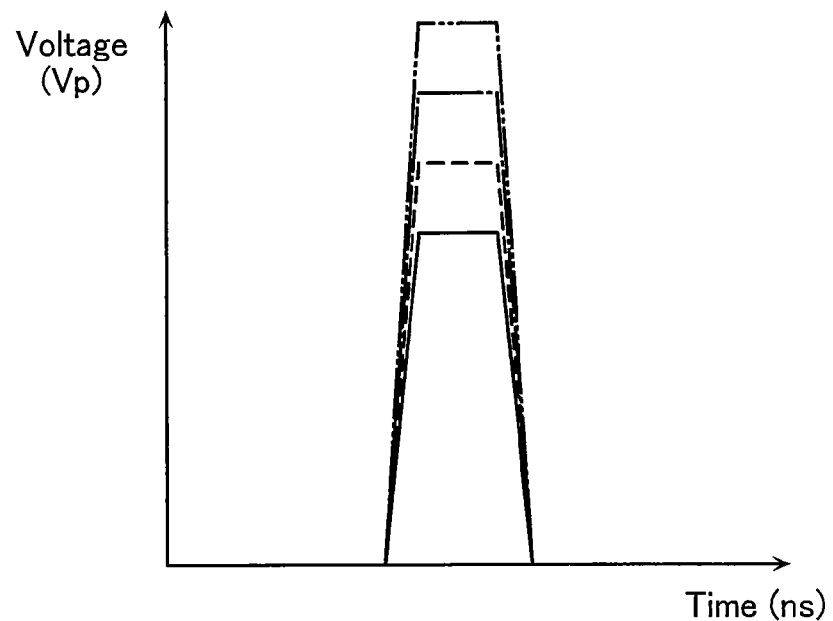
FIG. 11 is a graph showing a third example of pulse voltages for realizing writing of FIG. 8 in the semiconductor memory device according to the same embodiment.

Examples of the pulse voltage Vp under control of the pulse generator 7 on writing are shown in FIGS. 9-11.

FIG. 9 shows an example of the semiconductor memory device, which can not apply different pulse voltages Vp to the memory arrays CA at the same time. In this case, the height of the pulse voltage Vp is changed at each memory layer CA, thereby controlling electrical energy fed to the memory cell MC in each memory layer CA.

It is assumed now that data write occurs sequentially from the memory cell belonging to the uppermost memory layer CA3 to the memory cell belonging to the lowermost memory layer CA0. Initially, the state machine 7 accesses the memory cell array 1 to read a parameter specifying a pulse height on writing in each of the memory layers CA0-CA3, and stores the parameter in an inner resister or sets it in the pulse generator 8. Then, the state machine 7 uses the write address to identify the write target layer with the memory layer CA3 and controls the pulse generator 8 based on the parameter to generate a pulse having the magnitude in accordance with the memory layer CA3. Thus, the pulse generator 8 generates a pulse voltage Vp3 with the least energy. The pulse voltage Vp3 is applied as the program voltage Vp to the selected word line WL in the memory layer CA3. Thereafter, the height of the pulse voltage applied is increased sequentially toward the lowermost memory layer CA0, thereby evening the write characteristics among the memory cells in each of the memory layers.

FIG. 10 shows an example of changing not the height but the width of the pulse voltage, thereby controlling the electrical energy fed to the memory cells MC in each memory layer CA.

Thus, the lower the memory layer CA, the longer the pulse width applied is made to compensate for the write characteristic in each memory layer CA, which worsens in a lower layer than an upper layer, thereby evening the write characteristics among all the memory layers CA.

FIG. 11 shows an example of applying different pulse voltages to all the memory layers CA at the same time.

FIG. 11 shows application of pulse voltages different in height to the memory cells MC in the memory layers CA at the same time. In this case, naturally, faster writing can be achieved than those in FIGS. 9 and 10.

The following description is given to an example of realizing writing with the pulse voltage Vp applied several times.

Figure 12:
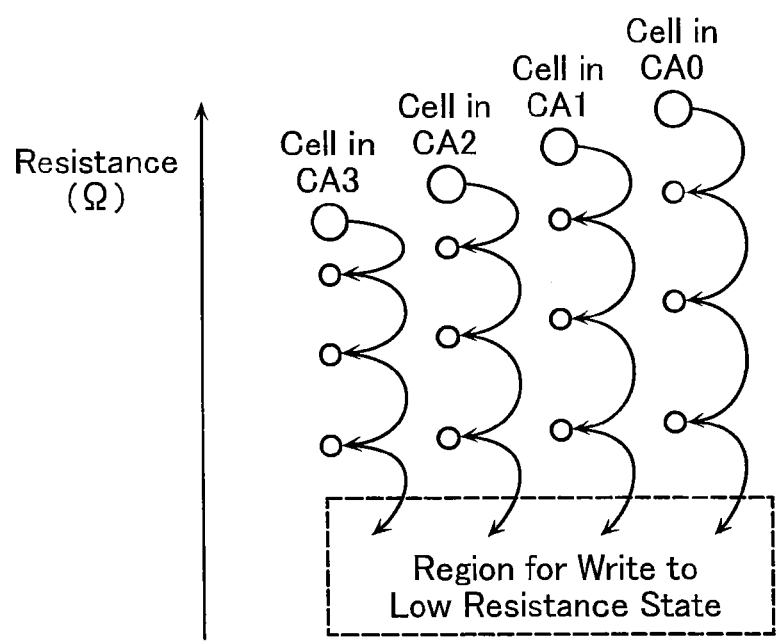
FIG. 12 is a brief diagram of writing with electrical energy stepped up several times in the semiconductor memory device according to the same embodiment.

As shown in FIG. 12, with writing executed in stages from the initial state to the programmed state, a sharp increase in current can be prevented from arising when the resistance of the variable resistor VR varies.

Figure 13:
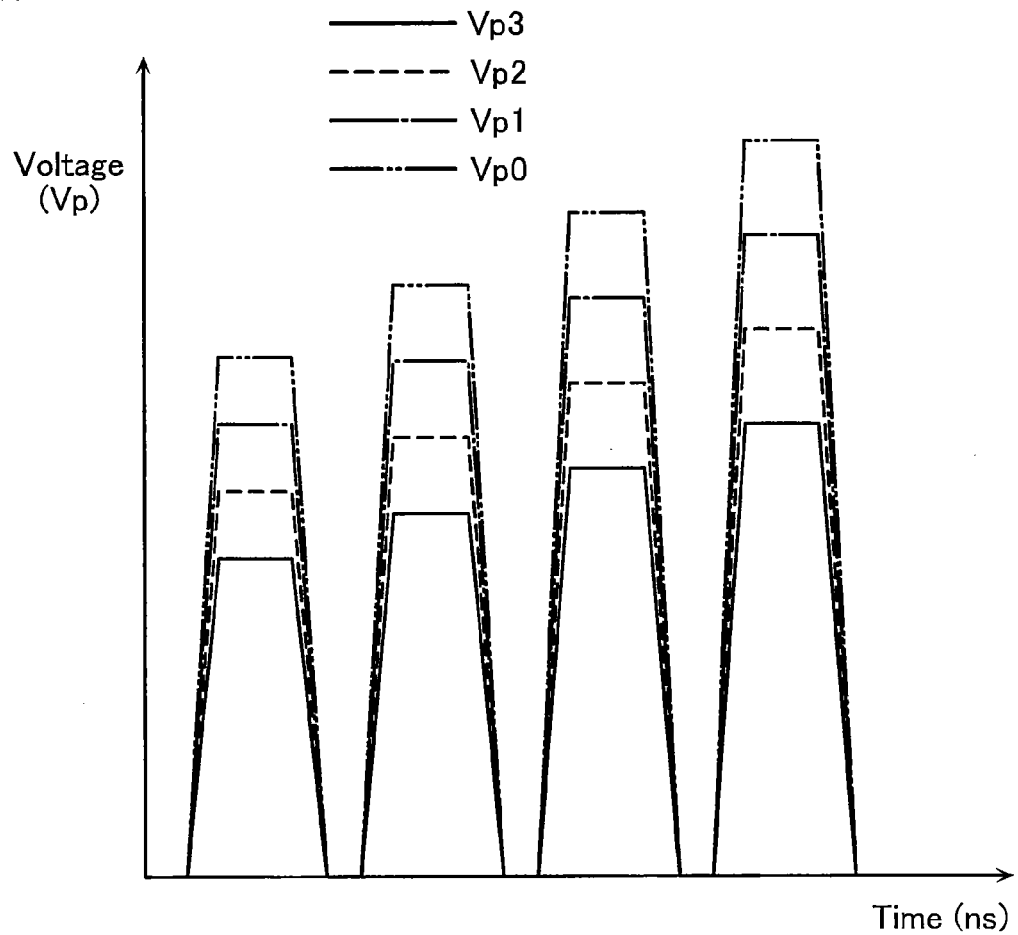
FIG. 13 is a graph showing pulse voltages for realizing writing of FIG. 13 in the semiconductor memory device according to the same embodiment.

FIG. 13 shows an example of the pulse voltages Vp under control of the pulse generator 7 for realizing writing shown in FIG. 12.

The pulse voltages different in height are applied to the lowermost memory layer CA0 through the uppermost memory layer CA3 like in the example of FIG. 11. Different from the example of FIG. 11, however, in the example of FIG. 13, the pulse generator 7 is controlled to apply a relatively low pulse voltage Vp to each memory layer CA and then repeatedly apply the pulse voltage Vp to the memory layers CA with increases in step width.

Writing may be processed faster with an extended step width.

Figure 14:
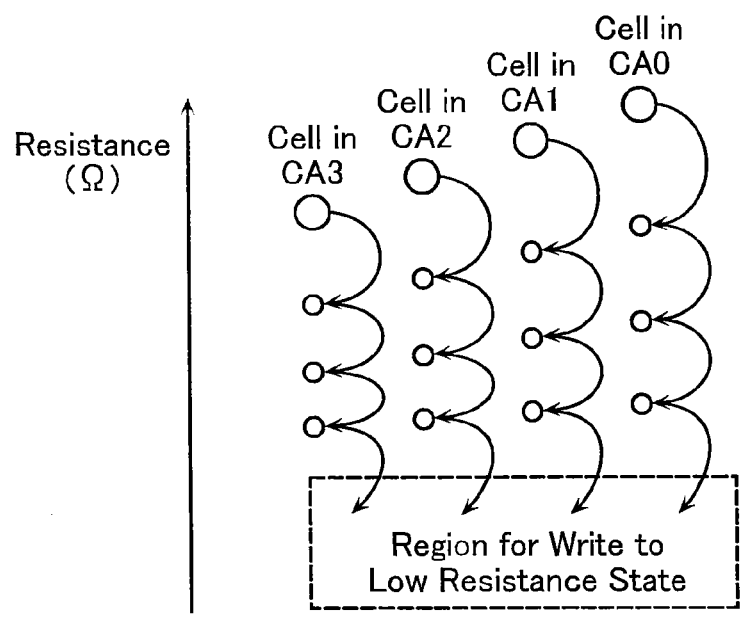
FIG. 14 is a brief diagram of writing with electrical energy stepped down several times in the semiconductor memory device according to the same embodiment.

On the other hand, the closer the state to the programmed one, the smaller the electrical energy fed may be made as shown in FIG. 14 to realize writing. Thus, it is possible to finely adjust the resistance as the state is closer to the programmed one, thereby achieving a narrower distribution of resistances of the memory cells MC in the programmed state.

Figure 15:
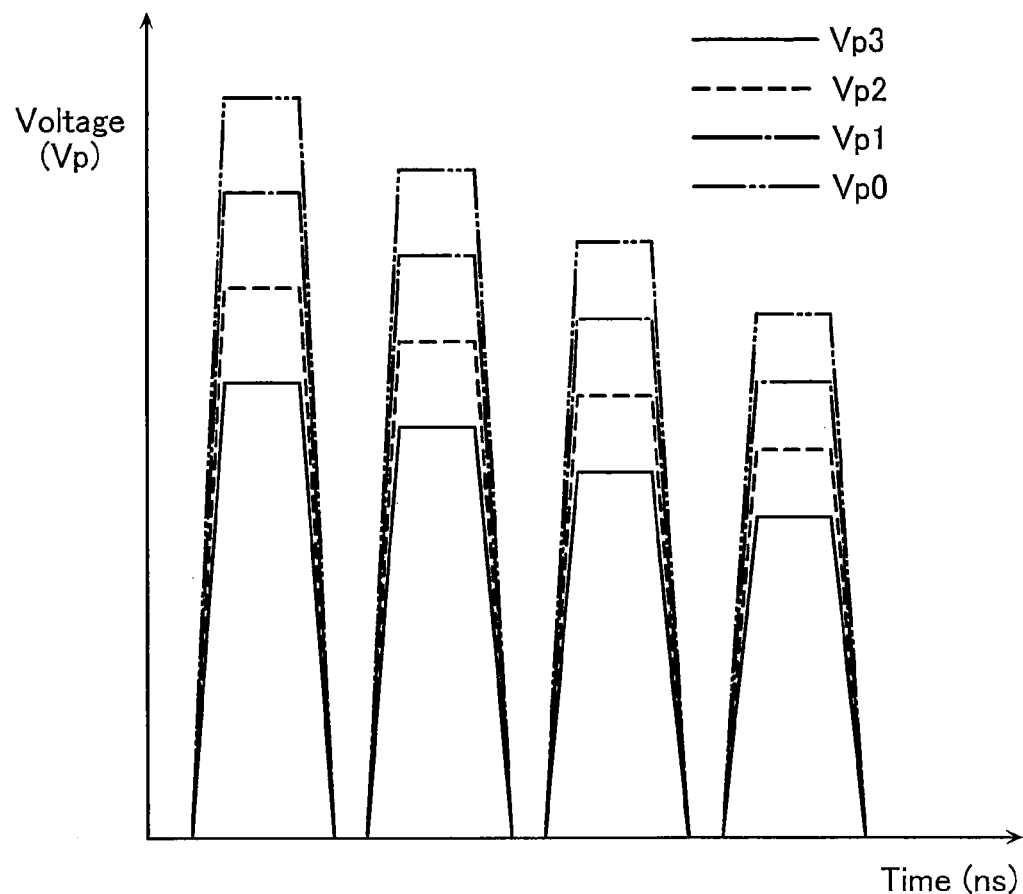
FIG. 15 is a graph showing an example of pulse voltages for realizing writing of FIG. 14 in the semiconductor memory device according to the same embodiment.

FIG. 15 shows an example of pulse voltages for realizing writing shown in FIG. 14.

In the example of FIG. 15, required electrical energy is fed in stages like in FIG. 13, though, the pulse generator 7 is controlled to repeatedly apply the pulse voltage Vp to the memory layers CA with decreases in step width.

In the present embodiment, differences in characteristic of lines, non-ohmic elements and variable resistance memory elements caused by the influence through the process of stacking layers can be evened by optimizing voltages and widths of write, erase and read pulses at each memory layer, thereby evening write, erase and read characteristics among the memory layers.

Second Embodiment

In the first embodiment, the differences in characteristic of variable resistors among the different memory layers are considered.

It is also required, however, to consider the differences in characteristic of non-ohmic elements, electrodes and wiring layers other than the variable resistors.

This is because the non-ohmic elements NO cause differences in impurity diffusion among the memory layers CA due to the influence by thermal histories, which cause variations in resistance, threshold, breakdown voltage and so forth while the electrodes and wiring layers cause differences in resistance due to the influence by oxidation and so forth.

Figure 16:
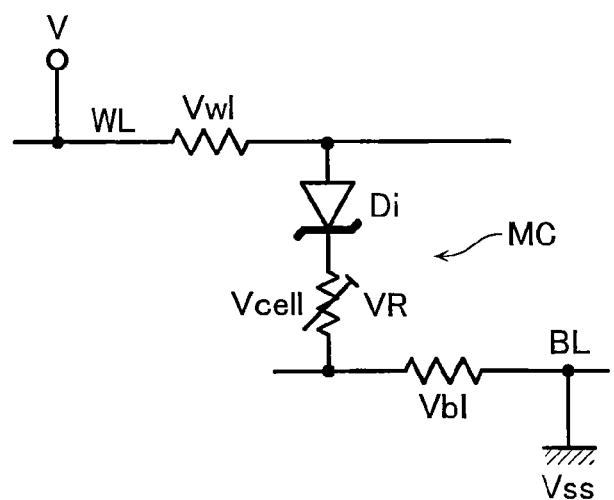
FIG. 16 is an equivalent circuit diagram of a memory cell and lines in a semiconductor memory device according to a second embodiment of the present invention.

Specifically, it is described with the use of FIG. 16.

FIG. 16 is an equivalent circuit diagram of a memory cell and lines in the semiconductor memory device according to the present embodiment.

The memory cell MC includes a diode D1 and a variable resistor VR serially connected to the diode D1 on the cathode. The anode of the diode D1 is connected to the word line WL. The other end of the variable resistor VR is connected to the bit line BL that is connected to the ground line Vss.

When a certain voltage V is applied to the word line WL in this circuit, the voltage Vcell across the memory cell MC is made equal to the voltage V minus (the voltage drop Vw1 on the word line WL plus the voltage drop Vb1 on the bit line BL).

Figure 17:
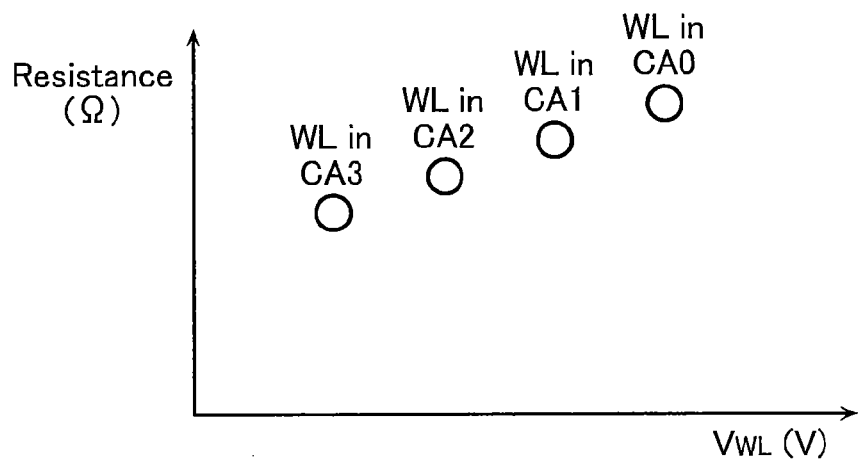
FIG. 17 is a graph showing relations between voltage drops and resistances of word lines in array layers in the semiconductor memory device according to the same embodiment.

Relations between the voltage drop Vw1 and the resistance of the word line WL in the memory layers are shown in FIG. 17. As described above, the lower the memory layer CA, which is greatly susceptible to the influence by heat through the process of stacking layers, the higher the resistance of the word line WL, which increases the voltage drop Vw1 accordingly, as can be found. Therefore, even if the same voltage V is applied to the memory layers, the voltage Vcell across the memory cell MC becomes smaller in a memory cell MC connected to the word line WL in a lower layer.

As a result, the differences in the voltage drop Vw1 on the word line WL lead to the differences in the voltage Vcell across the memory cell MC, and thus cause the differences in write, erase and read characteristics among the memory layers.

Figure 18:
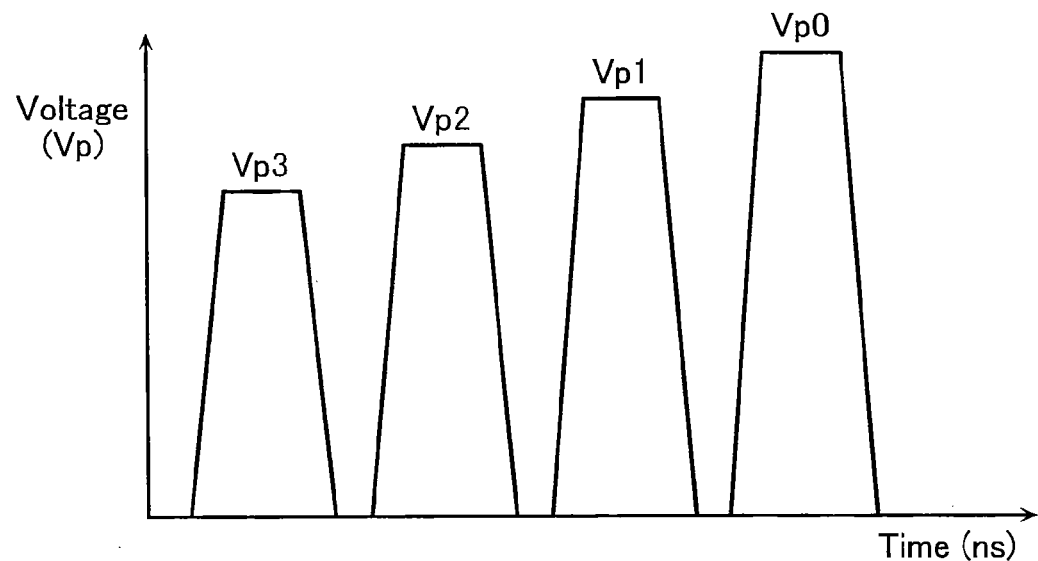
FIG. 18 is a graph showing an example of pulse voltages in the semiconductor memory device according to the same embodiment.

Write pulses for compensating for the differences in characteristics among the memory layers to even the characteristics are shown in FIG. 18.

As shown in FIG. 18, a higher pulse is applied to the word line WL belonging to a lower memory layer, thereby making the voltage Vcell across the memory cell MC at a constant voltage.

In the present embodiment, differences in characteristic of lines and non-ohmic elements in the stack-layer-structured semiconductor memory device using variable resistors caused by the influence through the process of stacking layers can be evened by optimizing voltages and widths of write, erase and read pulses at each memory layer. Thus, it is possible to provide a semiconductor memory device with evened write, erase and read characteristics among the memory layers.

Third Embodiment

The first and second embodiments consider variations in characteristic due to differences in thermal history and apply different pulse voltages to the memory layers correspondingly to even the characteristics among the memory layers.

Even the same memory layer, however, causes a voltage drop and a CR delay due to the parasitic resistances and capacitances on the word and bit lines. Accordingly, variations may arise in characteristic depending on the place of the memory cell. This causes a problem in particular when the memory layer has a larger size.

In a semiconductor memory device according to a third embodiment of the present invention, different pulse voltages are applied to the memory cells correspondingly in writing based on the address.

Figure 19:
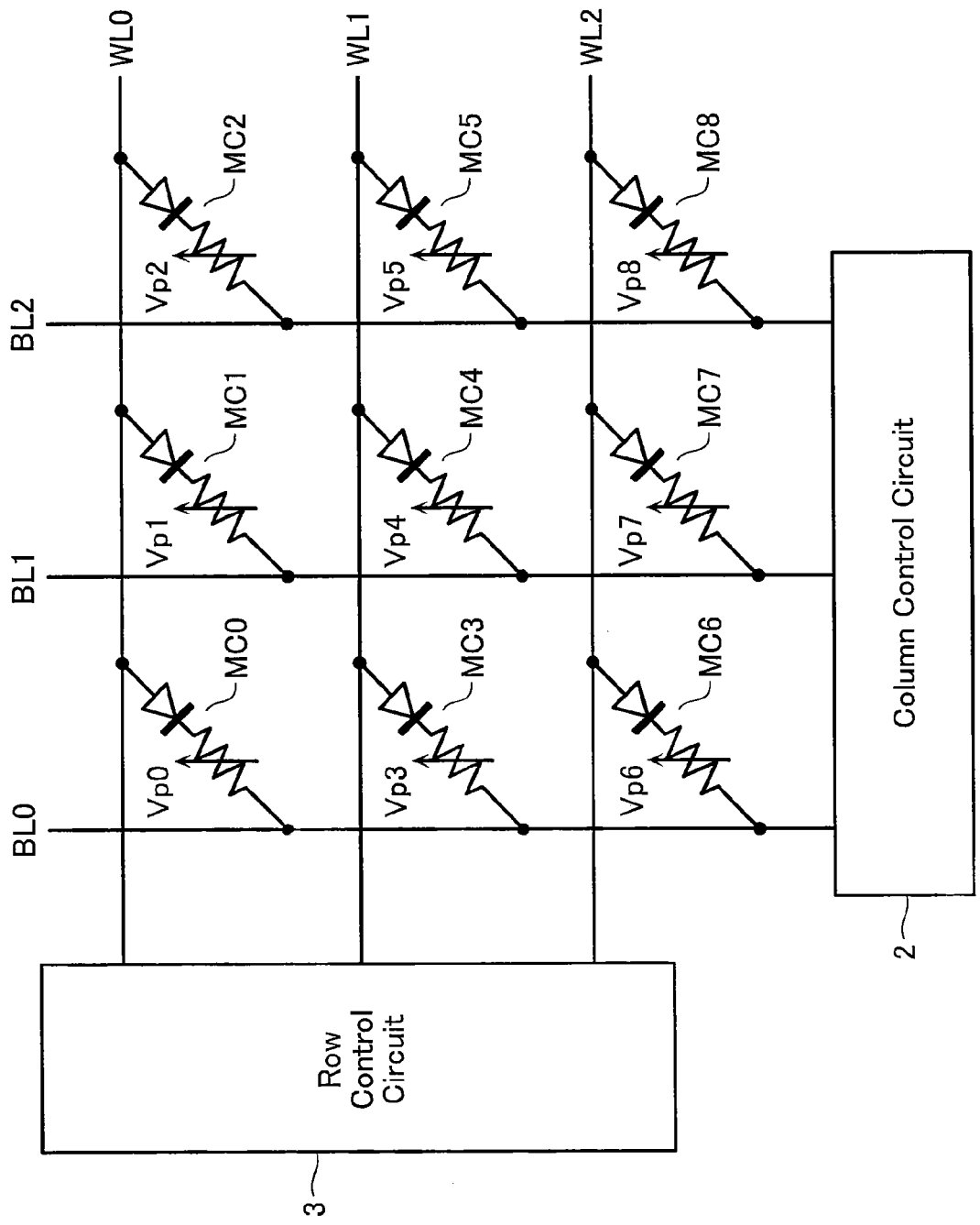
FIG. 19 is a circuit diagram showing part of a semiconductor memory device according to a third embodiment of the present invention.

FIG. 19 is a circuit diagram showing part of the semiconductor memory device according to the present embodiment.

This semiconductor device comprises a cell array, which contains word lines WL0-WL2, bit lines BL0-BL2 crossing these word lines WL, and memory cells MC0-MC8 provided at intersections of the word lines WL and the bit lines BL. A column control circuit 2 is arranged on one end of the bit line BL close to the word line WL2, and a row control circuit 3 on one end of the word line WL close to the bit line BL0.

Figure 20:
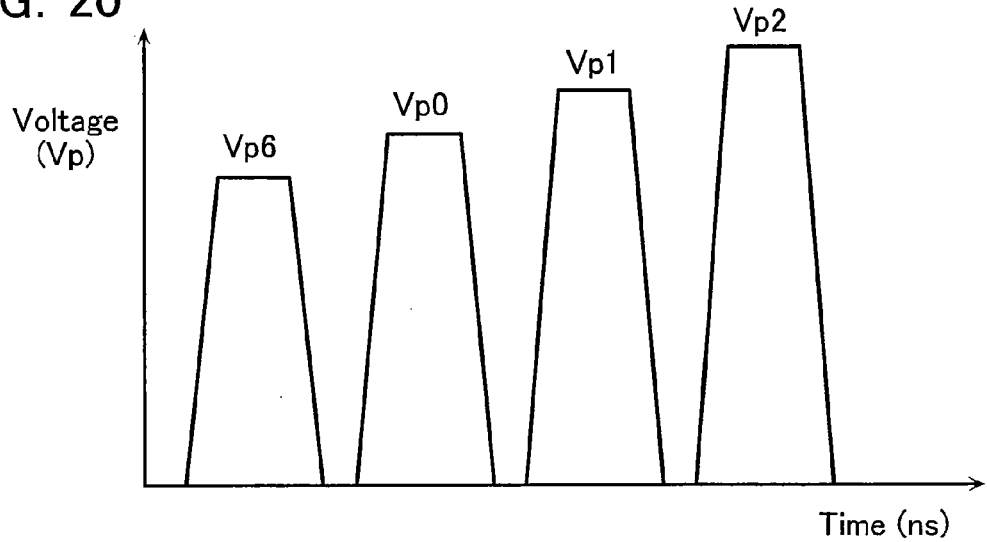
FIG. 20 provides a graph showing an example of pulse voltages in the semiconductor memory device according to the same embodiment.

FIG. 20 shows pulse voltages Vp6, Vp0, Vp1 and Vp2 on writing to the memory cells MC6, MC0, MC1 and MC2 shown in FIG. 19. In this example, the pulse voltages Vp are different in height among the memory cells MC.

Specifically, the lowermost pulse voltage Vp6 is applied to the memory cell MC6 located close to the means for supplying the pulse voltages Vp to the bit line BL and the word line WL, that is, closest to the column control circuit 2 and the row control circuit 3, and gradually higher pulse voltages Vp0, Vp1 and Vp2 are applied to the memory cells MC0, MC1 and MC2 arranged in order of location far from the column control circuit 2 and the row control circuit 3.

Figure 21:
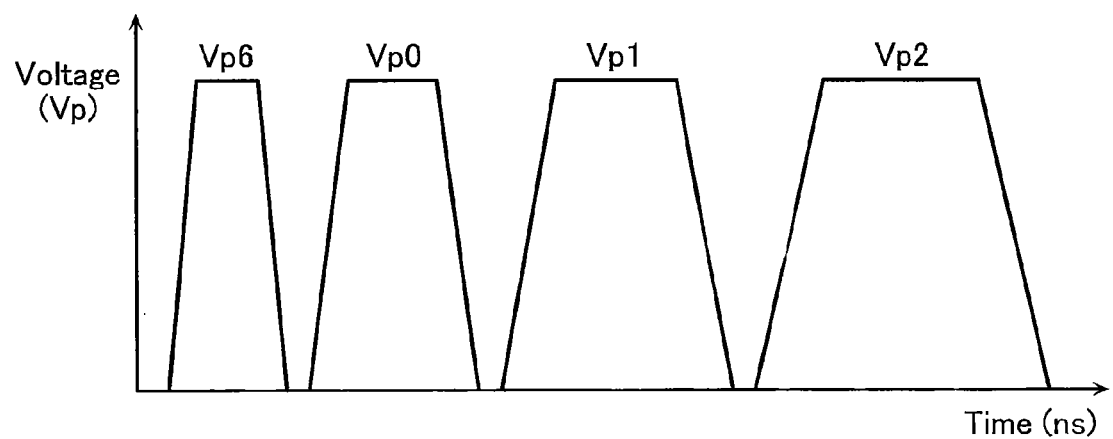
FIG. 21 is a graph showing another example of pulse voltages in the semiconductor memory device according to the same embodiment.

FIG. 21 shows an example of pulse voltages Vp with pulse widths varied among the memory cells MC such that pulse voltages Vp6, Vp0, Vp1 and Vp2 having gradually wider pulse widths are applied to the memory cells MC6, MC0, MC1 and MC2 in order.

As described above, in the present embodiment, pulse voltages Vp different in height or width are applied to the memory cells MC to compensate for variations in write characteristic due to the parasitic resistances and capacitances on the word line WL and bit line BL. Therefore, it is possible to provide a semiconductor memory device with evened write characteristics among the memory cells MC.

In the above description, different pulse voltages Vp are applied to the memory cells MC though different pulse voltages may be applied on a group basis if plural neighbor memory cells MC are grouped.

Fourth Embodiment

In writing, a sharply rising pulse voltage Vp may be applied to the memory cell MC. In such the case, under the influence of the parasitic capacitance on the diode D1 contained in the memory cell MC, it may be reverse-biased, thereby causing a disturb problem. To suppress this, making slower the rise of the pulse voltage Vp is effective. With this regard, in the case of writing to the memory cell MC located far from the column control circuit 2 and the row control circuit 3, the access path to that memory cell MC has an originally large parasitic resistance and capacitance, which makes slower the rise and fall of the pulse voltage Vp accordingly. On the other hand, in the case of the memory cell MC located close to the column control circuit 2 and the row control circuit 3, the pulse voltage Vp has a sharp rise and fall, which may cause a larger disturb risk accordingly.

In a semiconductor memory device according to a fourth embodiment of the present invention, a pulse voltage Vp with a slower rise and fall is applied to the memory cell MC located close to the column control circuit 2 and the row control circuit 3.

Figure 22:
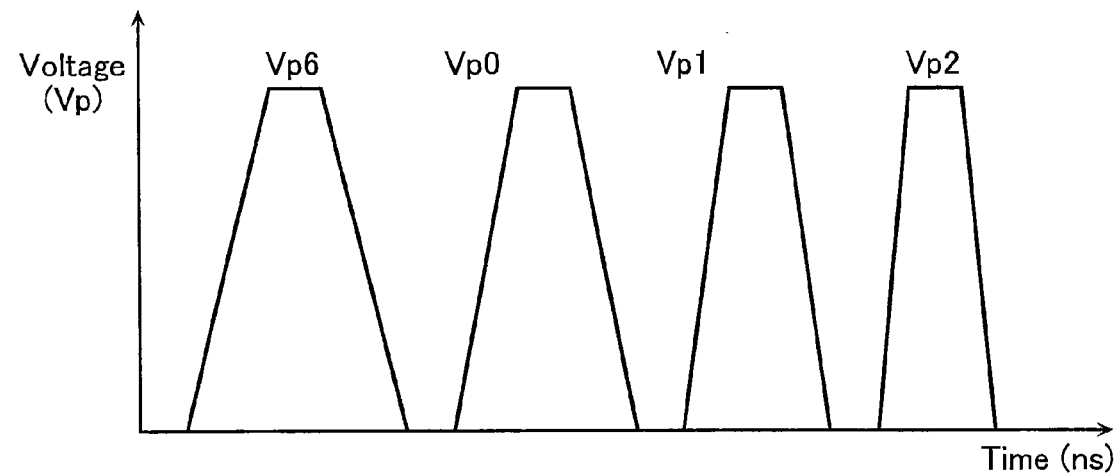
FIG. 22 provides a graph showing an example of pulse voltages in a semiconductor memory device according to a fourth embodiment of the present invention.

FIG. 22 shows pulse voltages Vp6, Vp0, Vp1 and Vp2 applied on writing to the memory cells MC6, MC0, MC1 and MC2 shown in FIG. 19 in the present embodiment.

As can be seen from FIG. 22, the pulse voltage Vp6 with the slowest rise and fall is applied to the memory cell MC6 located closest to the column control circuit 2 and the row control circuit 3, and the pulse voltages Vp0, Vp1 and Vp2 with gradually sharper rise and fall are applied to the memory cells MC0, MC1 and MC2 arranged in order of location far from the column control circuit 2 and the row control circuit 3.

As described above, in the present embodiment, the rise and fall of the pulse voltage Vp applied to the memory cell MC is made slower to suppress occurrences of disturb. In addition, pulse voltages Vp different in rise and fall time are applied to the memory cells MC correspondingly to even write characteristics among the memory cells MC.

The rise and fall time of the pulse voltage Vp can be adjusted among the memory cells MC as described above. Alternatively, it may be adjusted on a group basis if plural neighbor memory cells MC are grouped, or on a memory-layer basis.

Fifth Embodiment

A semiconductor memory device according to a fifth embodiment of the present invention applies pulse voltages several times to execute data write in stages and applies pulse voltages different in starting value of electrical energy to the memory cells correspondingly.

Specifically, a pulse voltage with a smaller starting value of electrical energy is applied to a memory cell excellent in write characteristic and a pulse voltage with a larger starting value of electrical energy to a memory cell poor in write characteristic. Thereafter, plural pulse voltages are applied while increasing electrical energy with a certain step width.

Figure 23:
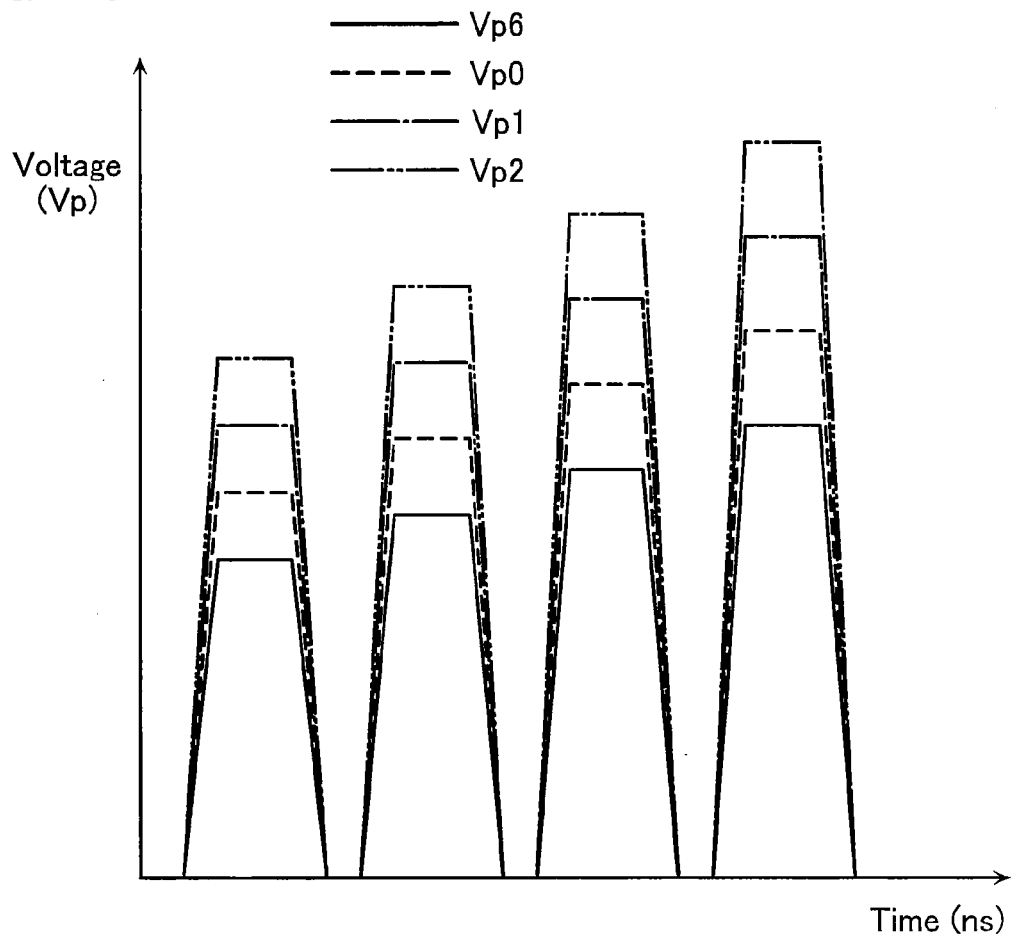
FIG. 23 provides a graph showing an example of pulse voltages in a semiconductor memory device according to a fifth embodiment of the present invention.

FIG. 23 provides a graph showing relations between time and pulse voltages Vp6, Vp0, Vp1 and Vp2 on writing to the memory cells MC6, MC0, MC1 and MC2 shown in FIG. 19. In this example, electrical energy is adjusted by the height of the pulse voltage Vp.

Sequentially from the memory cell MC6 located closest to the column control circuit 2 and the row control circuit 3 toward the memory cell MC2 located farthest therefrom, different pulse voltages Vp having gradually higher heights are applied, like in FIG. 20. In the example of FIG. 23, however, a relatively low pulse voltage Vp is applied to each memory cell MC and then the pulse voltage Vp with a gradually increased step width is applied repeatedly to the memory cell MC, different from the example of FIG. 20.

As described, execution of writing to each memory cell MC through plural pulse voltage applications makes it possible to prevent a sharp increase in current due to the variation in resistance of the variable resistor VR in each memory cell MC, like in the case of FIG. 12. Further, it is possible to reduce the variation in write characteristic caused by the position of the memory cell MC and make evener the write characteristics.

Not only the height of the pulse voltage Vp but also the step width may be changed on a memory cell MC basis.

Sixth Embodiment

A sixth embodiment of the present invention is similar to the fifth embodiment in execution of programming to the memory cell in stages except that verify is performed between steps and the result is used to adjust the electrical energy of the pulse voltage Vp applied at the next step.

Figure 24A:
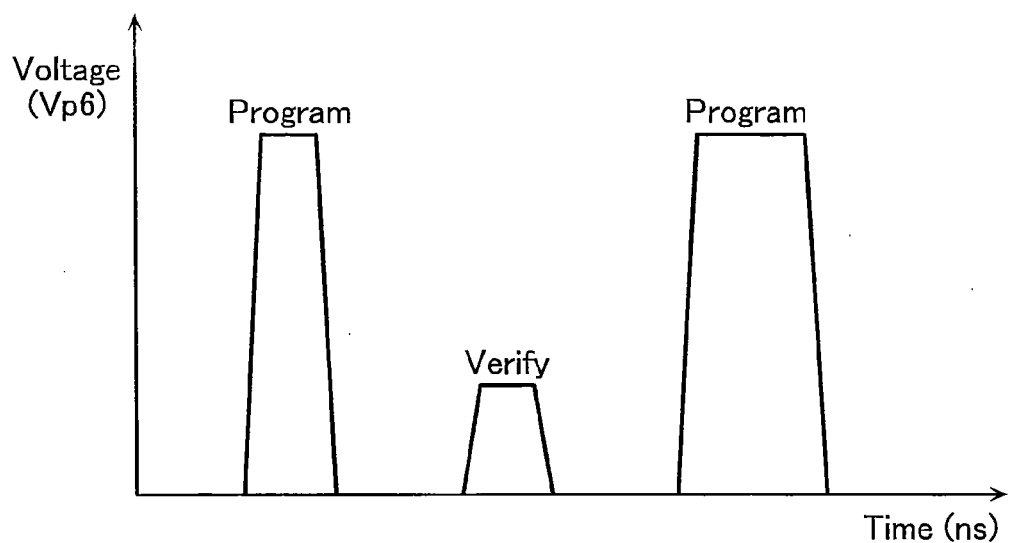
FIGS. 24A and 24B provide graphs showing an example of pulse voltages in a semiconductor memory device according to a sixth embodiment of the present invention.

FIG. 24A provides a graph showing a relation between time and voltage of the pulse voltage Vp6 applied to the memory cell MC6 shown in FIG. 19.

As shown in FIG. 24A, initially, a pulse voltage Vp6 having a certain pulse width is applied to the memory cell MC6 and then verifying is performed to read out the state of the memory cell MC6. As a result, if no data is programmed in the memory cell MC6, then a pulse voltage Vp6 with a wider pulse width is applied. Thereafter, verifying, adjusting the pulse width based on the verify result, and programming are repeated until data is normally programmed in the memory cell MC6.

Figure 24B:
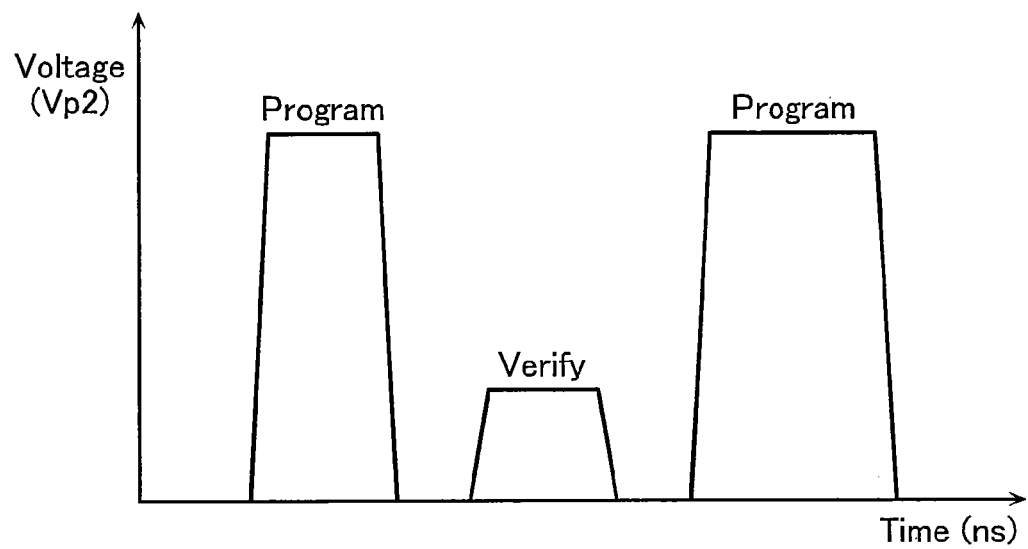

FIG. 24B provides a graph showing a relation between time and voltage of the pulse voltage Vp2 applied to the memory cell MC2, which is poorer in write characteristic than the memory cell MC6 and designed to have a wider initial pulse width than the memory cell MC6.

FIGS. 24A and 24B both show the examples of widening the pulse width in accordance with the verify result though the pulse width may be narrowed conversely. In this case, the state of the variable resistor VR in the memory cell MC can be made closer to a desired state with high accuracy.

Seventh Embodiment

When data program is performed in stages as in the sixth embodiment, the current flowing in the memory cell MC increases during the transition of the variable resistor VR in the memory cell MC from the high-resistance state to the low-resistance state, and accordingly it may destruct the memory cell MC possibly. With this regard, a limit imposed on the current flowing in the memory cell MC can reduce the possibility of destruction of the memory cell MC. If the current is limited, however, in the memory cell MC poor in write characteristic in particular, data write may not be normally performed possibly.

Therefore, in a semiconductor memory device according to a seventh embodiment of the present invention, the value of clamped current is determined for each memory cell MC, in more detail, in accordance with the address (the distance from the current source to the memory cell MC).

Figure 25:
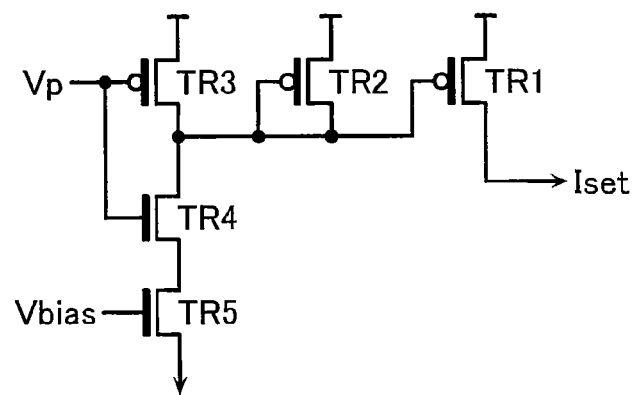
FIG. 25 is a circuit diagram showing a current limiter circuit in a semiconductor memory device according to a seventh embodiment of the present invention.

FIG. 25 shows a current limiter circuit operative to control the clamped current with the address.

The current limiter circuit includes a PMOS transistor TR1 operating in the saturation region, of which output or the set current Iset is controlled with the value of current flowing in a PMOS transistor TR2. A PMOS transistor TR3 and an NMOS transistor TR4 configure an inverter circuit, which is activated with the pulse voltage Vp for set. An NMOS transistor TR5 has a gate supplied with a bias voltage Vbias, of which level is used to determine the current flowing in the transistor TR2. Therefore, when the bias voltage Vbias is changed in accordance with the address, the clamping value of the set current Iset can be changed as well.

If the pulse height or width of the pulse voltage Vp is stepped up or down during the repetition of data program and verify as in the sixth embodiment, the above-described clamped current may also be stepped up or down correspondingly.

Figure 26A:
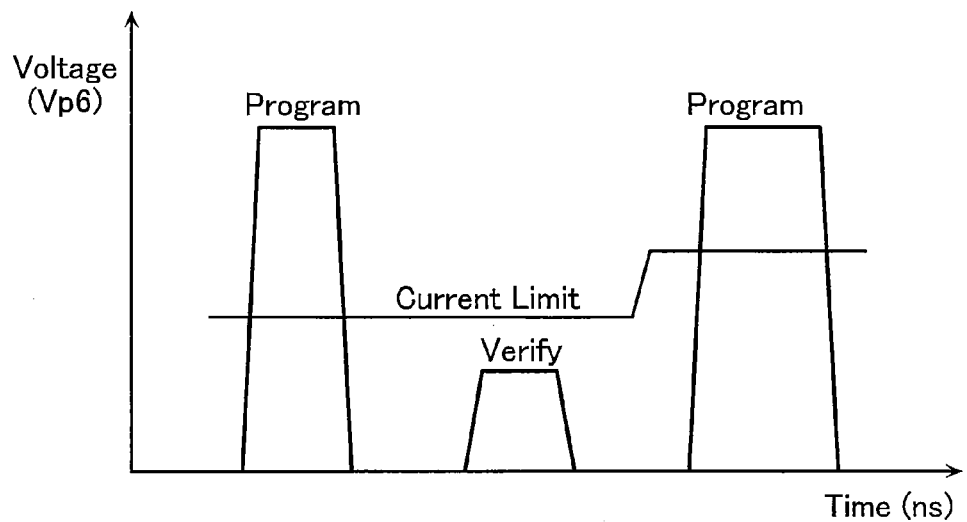
FIGS. 26A and 26B provide graphs showing an example of pulse voltages and limit values of current flowing in memory cells in the semiconductor memory device according to the seventh embodiment of the present invention.
Figure 26B:
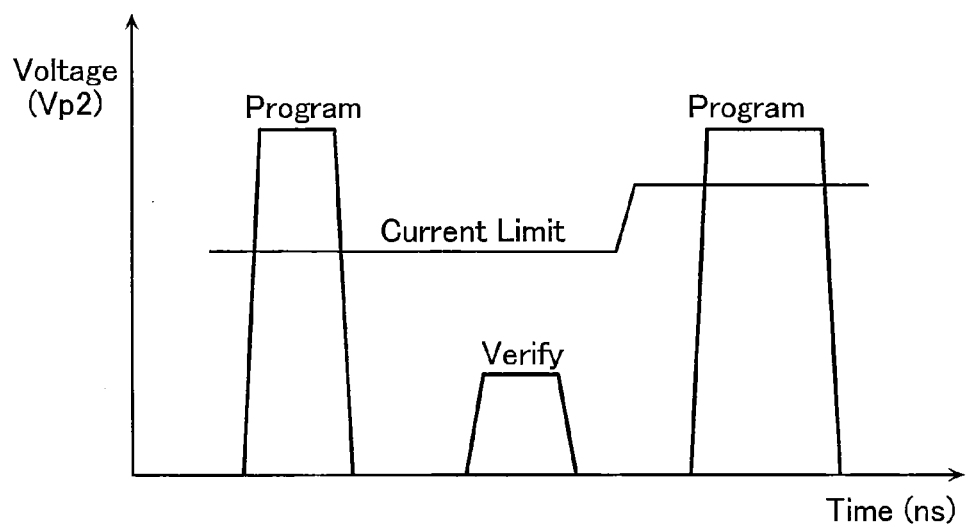

FIGS. 26A and 26B are diagrams showing such the embodiments.

FIG. 26A provides a graph showing a relation among time, the pulse voltage Vp6 and the limit value of current flowing in the memory cell MC6.

In the first data program, a certain current limit value is set and the pulse voltage Vp6 is applied. Thereafter, verify is performed to check the state of data programmed in the memory cell MC6 and the pulse voltage Vp6 stepped up or down in accordance with the result is applied and the clamped current is increased to the extent that is not destructive of the memory cell MC. Thus, in data program at the next step, it is possible to prevent excess current from destructing the memory cell MC and apply larger electric energy than the previous step.

FIG. 26B provides a graph showing a relation among time, the pulse voltage Vp2 and the limit value of current flowing in the memory cell MC2. The memory cell MC2 is poorer in write characteristic than the memory cell MC6 and requires application of larger electric energy. Even in this case, the current flowing in the memory cell MC2 is limited to prevent excess current from destructing the memory cell MC2 accordingly.

Figure 27:
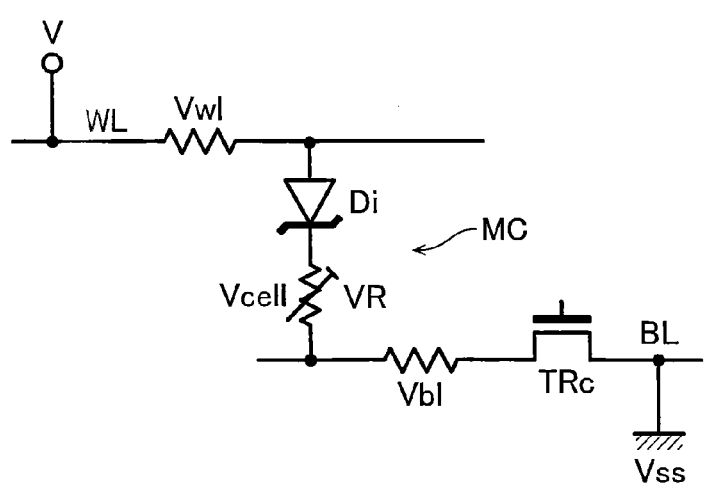
FIG. 27 is an equivalent circuit diagram of a memory cell and lines in a semiconductor memory device according to yet another embodiment of the present invention.

FIG. 27 is an equivalent circuit diagram of a memory cell and lines in a semiconductor memory device according to yet another embodiment of the present invention.

This circuit includes a current limit means or a current clamping transistor TRc interposed in the bit line BL additionally to the equivalent circuit shown in FIG. 16. This arrangement makes it possible to limit current flowing in the word line WL, the memory cell MC and the bit line BL in accordance with the base voltage on the transistor TRc. The base voltage on the transistor TRc can be controlled based on the resistance of the variable resistor VR.

OTHERS

Although writing is described above, the pulse voltage Vp can be controlled also on erasing and reading to even characteristics among the memory layers or memory cells.

It can be considered that thermal histories may influence on improvements in crystallinity and orientation, on reductions in initial resistance, and on improvements in write, erase and read characteristics in lower layers, in contrast to the cases of FIGS. 8-18.

Even in such the case, the electrical energy fed to the memory cell MC can be increased at a higher layer to even the characteristics among the memory layers CA or memory cells.

Even though there is no regularity in variations in write, erase and read characteristics, parameters corresponding to the memory layers CA may be prepared previously to control the pulse generator 7 in each of the memory layers CA or memory cells MC to even the characteristics among the memory layers CA or memory cells MC.

In the above-described examples, any one of the height and width of the pulse voltage Vp is controlled. It is though sufficient to adjust the electrical energy fed to the memory cell MC in each memory layer CA and, for example, both the height and width of the pulse voltage Vp may be controlled to exert the effect of the present invention as well.

What is claimed is:

1. A semiconductor memory device, comprising:
   a plurality of memory layers arranged in multilayer, each memory layer including a plurality of first lines, a plurality of second lines, and a plurality of memory cells selected by said first lines and said second lines;
   a pulse generator operative to generate pulses required for data access to an access target memory cell in said plurality of memory cells; and
   a control circuit operative to control said pulse generator such that the pulse output from said pulse generator has energy in accordance with the memory layer to which said access target memory cell belongs, wherein said control circuit controls said pulse generator based on said address of said access target memory cell and a parameter previously set at each of said memory layers; and
   a current limiter operative to limit current flowing in said access target memory cell on access to said access target memory cell, wherein said current limiter sets a limit value of current in accordance with an address of said access target memory cell.

2. The semiconductor memory device according to claim 1, wherein said parameter is held in any one of said memory cells.

3. The semiconductor memory device according to claim 1, wherein said pulse generator simultaneously supplies plural pulses different in at least one of width and height to said first or second lines in each of said memory layers.

4. The semiconductor memory device according to claim 1, wherein said pulse generator supplies plural pulses different in step width at each memory layer to said first or second lines in each of said memory layers.

5. The semiconductor memory device according to claim 4, wherein said pulse generator increases or reduces the energy of said pulse supplied as said access target memory cell nears an aimed physical state.

6. The semiconductor memory device according to claim 1, wherein said pulse generator reduces the energy of said pulse supplied as said memory layer becomes a higher layer.

7. The semiconductor memory device according to claim 1, wherein said pulse generator reduces the energy of said pulse supplied as said memory layer becomes an upper layer.

8. The semiconductor memory device according to claim 1, wherein said plurality of memory cells are disposed in a matrix in each of said memory layers.

9. A semiconductor memory device, comprising:
   a plurality of memory layers arranged in multilayer, each memory layer including a plurality of first lines, a plurality of second lines, and a plurality of memory cells selected by said first lines and said second lines;
   a pulse generator operative to generate pulses required for data access to an access target memory cell in said plurality of memory cells; and
   a control circuit operative to control said pulse generator such that the pulse output from said pulse generator has energy in accordance with said memory layer to which said access target memory cell belongs, wherein said pulse generator supplies plural pulses different in step width at each memory layer to said first or second lines in each of said memory layers.

10. The semiconductor memory device according to claim 9, wherein said control circuit controls said pulse generator based on an address of said access target memory cell and a parameter previously set at each of said memory layers.

11. The semiconductor memory device according to claim 10, wherein said parameter is held in any one of said memory cells.

12. The semiconductor memory device according to claim 9, wherein said pulse generator simultaneously supplies plural pulses different in at least one of width and height to said first or second lines in each of said memory layers.

13. The semiconductor memory device according to claim 9, wherein said pulse generator increases or reduces the energy of said pulse supplied as said access target memory cell nears an aimed physical state.

14. The semiconductor memory device according to claim 9, wherein said pulse generator reduces the energy of said pulse supplied as said memory layer becomes a higher layer.

15. The semiconductor memory device according to claim 9, wherein said pulse generator reduces the energy of said pulse supplied as said memory layer becomes an upper layer.

16. The semiconductor memory device according to claim 9, wherein said plurality of memory cells are disposed in a matrix in each of said memory layers.

17. A semiconductor memory device, comprising:
a silicon substrate;
a plurality of memory layers arranged in multilayer, each memory layer including a plurality of first lines, a plurality of second lines, and a plurality of memory cells selected by said first lines and second lines;
a pulse generator operative to generate pulses required for data access to an access target memory cell in said plurality of memory cells;
a control circuit operative to control said pulse generator such that the pulse output from said pulse generator has energy in accordance with the memory layer to which said access target memory cell belongs; and
a current limiter operative to limit current flowing in said access target memory cell on access to said access target memory cell, wherein said control circuit controls said pulse generator based on an address of the access target memory cell and a parameter previously set at each of said memory layers.

18. The semiconductor memory device according to claim 17, wherein said parameter is held in any one of said memory cells.

19. The semiconductor memory device according to claim 17, wherein said pulse generator simultaneously supplies plural pulses different in at least one of width and height to said first or second lines in each of said memory layers.

20. The semiconductor memory device according to claim 17, wherein said pulse generator supplies plural pulses different in step width at each memory layer to said first or second lines in each of said memory layers.

21. The semiconductor memory device according to claim 20, wherein said pulse generator increases or reduces the energy of said pulse supplied as said access target memory cell nears an aimed physical state.

22. The semiconductor memory device according to claim 17, wherein said pulse generator reduces the energy of said pulse supplied as the memory layer becomes a higher layer.

23. The semiconductor memory device according to claim 17, wherein said pulse generator reduces the energy of said pulse supplied as the memory layer becomes an upper layer.

24. The semiconductor memory device according to claim 17, wherein said plurality of memory cells are disposed in a matrix in said each of memory layers.

* * * * *